(12) United States Patent
Kantake (10) Patent No.: US 7,549,099 B2
(45) Date of Patent: Jun. 16, 2009

(54) TESTING APPARATUS AND TESTING METHOD

(75) Inventor: Shusuke Kantake, Tokyo (JP)

(73) Assignee: Advantest Corporation, Tokyo (JP)

( * ) Notice: Subject to any disclaimer, the term of this patent is extended or adjusted under 35 U.S.C. 154(b) by 672 days.

(21) Appl. No.: 11/083,114

(22) Filed: Mar. 17, 2005

(65) Prior Publication Data

US 2007/0006031 A1    Jan. 4, 2007

Related U.S. Application Data

(63) Continuation of application No. PCT/JP2005/004370, filed on Mar. 11, 2005.

(30) Foreign Application Priority Data

Mar. 26, 2004    (JP) .............................. 2004-093310

(51) Int. Cl.
*G06F 11/277* (2006.01)
*G06F 11/36* (2006.01)

(52) U.S. Cl. ...................... 714/737; 714/724
(58) Field of Classification Search ................. None
See application file for complete search history.

(56) References Cited

U.S. PATENT DOCUMENTS 6,285,722 B1 *  9/2001  Banwell et al. ............. 375/354
6,462,996 B2 * 10/2002  Ooishi ........................ 365/201
6,794,913 B1 *  9/2004  Stengel ....................... 327/158
7,058,865 B2 *  6/2006  Mori et al. ................... 714/724
2003/0007586 A1 *  1/2003  Ishii ........................... 375/376

FOREIGN PATENT DOCUMENTS

| JP | 55164947 A | * 12/1980 |
| JP | 2003-98233 | 4/2003 |
| JP | 2003-227864 | 8/2003 |
| JP | 2003-344507 | 12/2003 |

OTHER PUBLICATIONS

International Search Report issued in International Application No. PCT/JP2005/004370 mailed on Jun. 14, 2005, 1 page.

* cited by examiner

*Primary Examiner*—Cynthia Britt
*Assistant Examiner*—Dipakkumar Gandhi
(74) *Attorney, Agent, or Firm*—Osha • Liang LLP (57) ABSTRACT

A testing apparatus includes a logic comparing unit for comparing the output value with a predetermined expectation value; a pass/fail determining module for determining pass/fail of the device under test based on the comparison result of the logic comparing unit; and a clock generating circuit including a first phase comparing unit for comparing phase of the output data of the device under test with that of the reproduced clock and outputting a first comparison result signal; a second phase comparing unit for comparing phase of the reference clock with that of the reproduced clock and outputting a second comparison result signal; and a reproduced clock generating module for generating the reproduced clock based on the first and second comparison result signals.

16 Claims, 6 Drawing Sheets

TESTING APPARATUS AND TESTING METHOD

The present application is a continuation application of PCT/JP2005/004370 filed on Mar. 11, 2005, claiming priority from a Japanese patent application No. 2004-93310 filed on Mar. 26, 2004, the contents of which are incorporated herein by reference.

BACKGROUND OF THE INVENTION

1. Field of the Invention

The present invention relates to a testing apparatus and a testing method. More particularly, the present invention relates to a testing apparatus and a testing method for testing a memory to be tested.

2. Description of the Related Art

Figure 6:
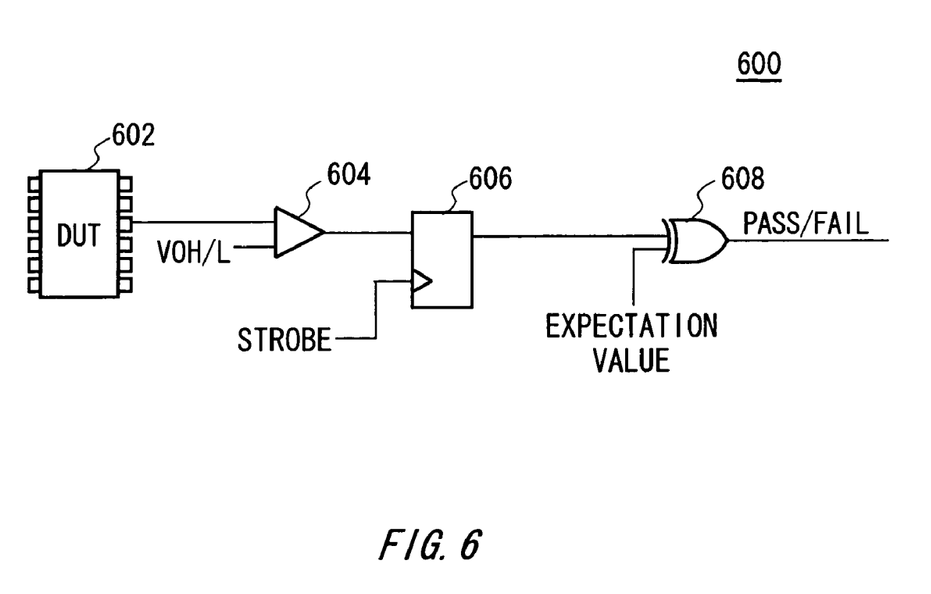
FIG. 6 shows the configuration of a conventional testing apparatus.

FIG. 6 shows the configuration of a conventional testing apparatus 600. The testing apparatus 600 includes a level comparator 604, a timing comparator 606, and a logic comparing unit 608. The level comparator 604 conducts voltage comparison of output data output from a device under test 602 (hereinafter, referred to "DUT"), and then, the output data is obtained by the timing comparator 606 by a strobe generated at a timing predetermined inside the testing apparatus 600. Then, the output data is compared with an expectation value by the logic comparing unit 608 and pass/fail of the DUT 602 is determined.

Recently, a high-speed serial interface is developed to perform communication in a way of transmitting data in which a clock is embedded on a transmitting unit side, reproducing the clock from the data on a receiving unit side, and receiving the data at the reproduced clock. Further, uncertain width of timing (jitter) of a predetermined size is allowable for data of a high-speed serial interface of this kind of clock embedding method. However, according to the conventional testing apparatus 600, since the timing of the strobe, by which the DUT 602 obtains the output data, is predetermined inside the testing apparatus 600, it is impossible to follow up variation of the timing of the output data of the DUT 602. Thus, it is impossible to test a device under test including the high-speed serial interface accurately.

SUMMARY OF THE INVENTION

Therefore, it is an object of the present invention to provide a testing apparatus, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a testing apparatus for testing a device under test includes: a reference clock source for generating a reference clock for controlling operation of the device under test; a clock generating circuit for generating a reproduced clock of which frequency and phase are substantially the same as frequency of the reference clock and phase of output data of the device under test, respectively; a delay circuit for generating a strobe for delaying the reproduced clock; a timing comparator for obtaining an output value of the output data based on the strobe; a logic comparing unit for comparing the output value with a predetermined expectation value; and a pass/fail determining module for determining pass/fail of the device under test based on the comparison result of the logic comparing unit.

The clock generating circuit includes: a first phase comparing unit for comparing phase of the output data of the device under test with that of the reproduced clock and outputting a first comparison result signal; a second phase comparing unit for comparing phase of the reference clock with that of the reproduced clock and outputting a second comparison result signal; an adding unit for adding the first comparison result signal and the second comparison result signal and outputting an addition result signal; and a reproduced clock generating module for generating the reproduced clock based on the addition result signal.

The testing apparatus may further include a first low pass filter for passing only the first comparison result signal of which frequency is lower than a first frequency, and the adding unit may add the first comparison result signal passing through the first low pass filter and the second comparison result signal.

The first frequency showing a passband of the first low pass filter may be set according to the kind of the device under test. The first frequency showing the passband of the first low pass filter may be set to correspond to an allowable jitter frequency of the device under test. A delay amount of the delay circuit may be set to correspond to specification of the device under test.

The testing apparatus may further include a second low pass filter passing only the addition result signal of which frequency is lower than a second frequency, and the reproduced clock generating module may generate the reproduced clock based on the addition result signal passing through the second low pass filter.

The second frequency showing a passband of the second low pass filter may be higher than or substantially the same as the first frequency.

The first low pass filter may output the hold signal of the fixed value instead of the first comparison result signal in case the output data is unstable.

The first low pass filter may output the fixed value instead of the first comparison result signal within a predetermined time from the time when the device under test begins to output the output data.

According to the second aspect of the present invention, a testing apparatus for testing a device under test includes: a clock generating circuit for generating a reproduced clock of which phase is substantially the same as that of output data of the device under test, respectively; a delay circuit for generating a strobe for delaying the reproduced clock; a timing comparator for obtaining an output value of the output data based on the strobe; a logic comparing unit for comparing the output value with a predetermined expectation value; and a pass/fail determining module for determining pass/fail of the device under test based on the comparison result of the logic comparing unit.

The clock generating circuit includes: a phase comparing unit for comparing phase of the output data of the device under test with that of the reproduced clock and outputting a comparison result signal; a first low pass filter for passing only the comparison result signal of which frequency is lower than a predetermined frequency set according to the kind of the device under test; and a reproduced clock generating module for generating the reproduced clock based on the comparison result signal.

The phase comparing unit may compare phase of an output clock of the device under test with that of the reproduced clock generated by the reproduced clock generating module and output the comparison result. The testing apparatus may further include a frequency divider for dividing frequency of the reproduced clock generated by the reproduced clock generating module, and the phase comparing unit may compare phase of an output clock of the device under test with that of the reproduced clock of which frequency is divided by the frequency divider and output the comparison result.

According to the third aspect of the present invention, a testing method for testing a device under test includes: a step of generating a reference clock for controlling operation of the device under test; a clock reproducing step of generating a reproduced clock of which frequency and phase are substantially the same as frequency of the reference clock and phase of output data of the device under test, respectively; a step of generating a strobe for delaying the reproduced clock; a step of obtaining an output value of the output data based on the strobe; a step of comparing the output value with a predetermined expectation value; and a step of determining pass/fail of the device under test based on the comparison result.

The clock reproducing step includes steps of: comparing phase of the output data of the device under test with that of the reproduced clock and outputting a first comparison result signal; comparing phase of the reference clock with that of the reproduced clock and outputting a second comparison result signal; adding the first comparison result signal and the second comparison result signal and outputting an addition result signal; and generating the reproduced clock based on the addition result signal.

According to the fourth aspect of the present invention, a testing method for testing a device under test includes: a clock reproducing step of generating a reproduced clock of which phase is substantially the same as that of output data of the device under test, respectively; a step of generating a strobe for delaying the reproduced clock; a step of obtaining an output value of the output data based on the strobe; a step of comparing the output value with a predetermined expectation value; and a step of determining pass/fail of the device under test based on the comparison result.

The clock reproducing step includes: a step of comparing phase of the output data of the device under test with that of the reproduced clock and outputting a comparison result signal; a step of passing only the comparison result signal of which frequency is lower than a predetermined frequency set according to the kind of the device under test; and a reproduced clock generating step of generating the reproduced clock based on the comparison result signal.

The clock reproducing step may further include a step of comparing phase of an output clock of the device under test with that of the reproduced clock generated in the reproduced clock generating step and outputting a comparison result signal.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
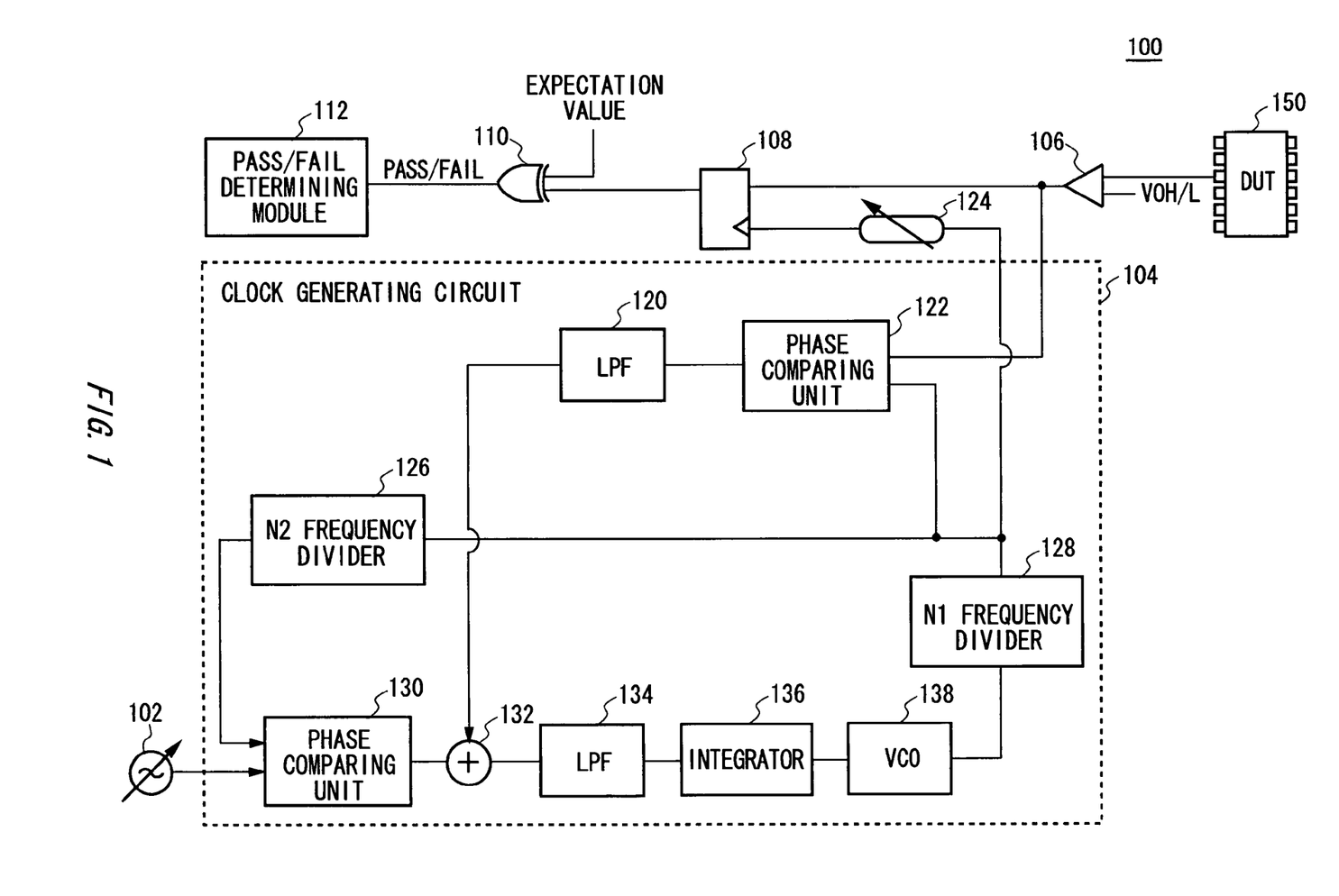
FIG. 1 shows an example of the configuration of a testing apparatus according to a first embodiment.
Figure 2:
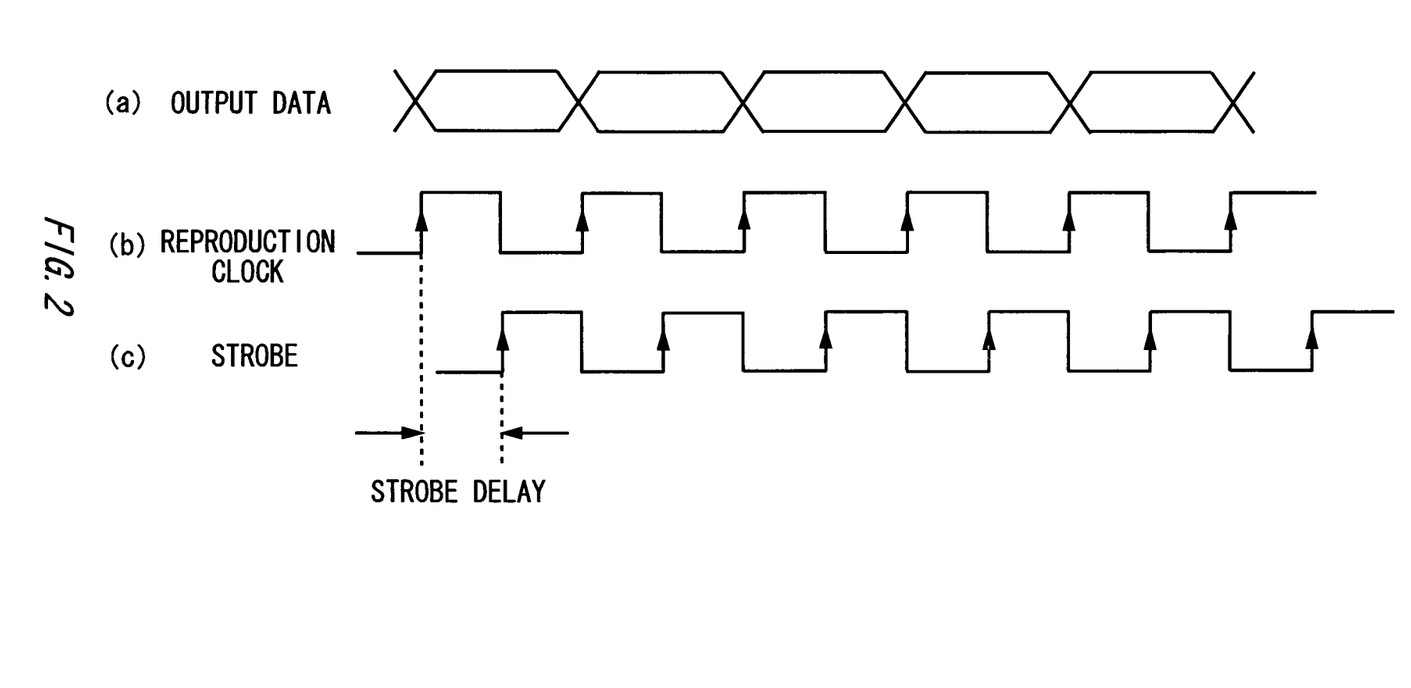
FIG. 2 is a timing chart of output data, a reproduced clock, and a strobe.

FIG. 1 shows an example of the configuration of a testing apparatus 100 according to a first embodiment of the present invention. FIG. 2A shows an example of a timing chart of output data of a DUT 150 according to the first embodiment. FIG. 2B shows an example of a timing chart of a reproduced clock generated by a VCO 138 according to the first embodiment. FIG. 2C shows an example of a timing chart of a strobe generated by a variable delay circuit 124 according to the first embodiment.

The testing apparatus 100 includes a reference clock source 102, a clock generating circuit 104, a level comparator 106, a variable delay circuit 124, a timing comparator 108, a logic comparing unit 110, and a pass/fail determining module 112. Further, the pass/fail determining module 112 may be realized by executing a program by a CPU included in the testing apparatus 100 or by an analyzing apparatus such as a workstation provided outside the testing apparatus 100.

The reference clock source 102 generates a reference clock for controlling operation of the DUT 150. The DUT 150 operates based on the reference clock generated by the reference clock source 102 and outputs such output data as shown in FIG. 2A. Then, the level comparator 106 compares the output data output from the DUT 150 with a predetermined threshold value voltage and outputs a binary output data. Further, the clock generating circuit 104 generates a reproduced clock of which frequency is substantially the same as that of the reference clock generated by the reference clock source 102 and of which phase is substantially the same as that of the output data of the DUT 150 as shown in FIG. 2B.

The variable delay circuit 124 delays the reproduced clock generated by the clock generating circuit 104 and generates a strobe as shown in FIG. 2C. The delay amount of the variable delay circuit 124 is set according to specification of the DUT 150. For example, the delay amount of the variable delay circuit 124 is a half of the cycle time of the output data of the DUT 150. Further, the variable delay circuit 124 also has a function of adjusting a phase difference between the phase comparing unit 122 and the timing comparator 108. Thus, the variable delay circuit 124 may be provided just before the phase comparing unit 122 on a transmission path from an N1 frequency divider 128 to the phase comparing unit 122. In this case, the VCO 138 generates a reproduced clock having a predetermined phase difference with respect to the output data of the DUT 150.

The timing comparator 108 obtains an output value of the output data of the DUT 150 based on the strobe generated by the variable delay circuit 124. The logic comparing unit 110 is, for example, an EXOR operation circuit. The logic comparing unit 110 compares the output value obtained by the timing comparator 108 with a predetermined expectation value and outputs a fail data or a pass data. Then, the pass/fail determining module 112 determines pass/fail of the DUT 150 based on the comparison result of the logic comparing unit 110.

The clock generating circuit 104 includes an LPF 120, a phase comparing unit 122, an N2 frequency divider 126, an N1 frequency divider 128, a phase comparing unit 130, an adding unit 132, an LPF 134, an integrator 136, and a VCO 138. The clock generating circuit 104 synchronizes phase of the reproduced clock and the output data by a phase locked loop circuit including the phase comparing unit 122, the LPF 120, the LPF 134, the integrator 136, the VCO 138, and the N1 frequency divider 128 and makes frequency of the reproduced clock coincide with that of the reference clock by a frequency locked loop circuit including the phase comparing unit 130, the LPF 134, the integrator 136, the VCO 138, the N1 frequency divider 128, and the N2 frequency divider 126. Further, the phase comparing unit 122 and the LPF 120 are an early-late gate circuit and a digital filter, respectively, for example. The VCO 138 is an example of a reproduced clock generating module of the present invention.

The phase comparing unit 122 compares phase of the output data of the DUT 150 output from the level comparator 106 with that of the reproduced clock which is generated by the VCO 138 and of which frequency is divided by N1 by the N1 frequency divider 128 and outputs a first comparison result signal. The LPF 120 passes only the first comparison result signal output from the phase comparing unit 122 of which frequency is lower than a first frequency and provides the adding unit 132 with it. Further, the first frequency showing a passband of the LPF 120 is set according to the kind of the DUT 150, for example, allowable jitter frequency of the DUT 150. Specifically, in case the frequency of the output data of the DUT 150 is substantially 6.5 GHz, the first frequency is set to, for example, 100 kHz.

Further, each of the N1 frequency divider 128 and the N2 frequency divider 126 divides the frequency of the reproduced clock generated by the VCO 138 and provides the phase comparing unit 130 with the reproduced clock. The phase comparing unit 130 compares phase of the reference clock generated by the reference clock source 102 with that of the reproduced clock which is generated by the VCO 138 and of which frequency is divided by the N1 frequency divider 128 and the N2 frequency divider 126 (N1×N2) and provides the adding unit 132 with a second comparison result signal.

The adding unit 132 adds the first comparison result signal which is output by the phase comparing unit 122 and passed through the LPF 120 to the second comparison result signal output by the phase comparing unit 130 and outputs the addition result signal. The LPF 134 passes only the addition result signal output by the adding unit 132 of which frequency is lower than a second frequency and provides the integrator 136 with it. Further, the second frequency showing a passband of the LPF 134 is higher than the first frequency showing the passband of the LPF 120. Specifically, in case the frequency of the output data of the DUT 150 is 6.5 GHz, the second frequency is set to, for example, several MHz. Further, the second frequency showing the passband of the LPF 134 may be substantially the same as the first frequency showing the passband of the LPF 120.

The integrator 136 integrates the addition result signal output by the LPF 134 and provides the VCO 138 with it. The VCO 138 generates a reproduced clock based on the integral of the addition result signal passing through the LPF 134 which is obtained by the integrator 136 and provides the phase comparing unit 122 and the variable delay circuit 124 with it.

In the following, operation of the testing apparatus 100 is described according to testing flow of the DUT 150. First, as an initial setting, frequency of the reference clock generated by the reference clock source 102, frequency dividing ratios of the N1 frequency divider 128 and the N2 frequency divider 126 (N1, N2) are set based on the output data rate of the DUT 150. Then, if the frequency is synchronized by the frequency locked loop circuit after a predetermined time elapsed, the VCO 138 generates a reproduced clock of which phase is synchronized with that of the reference clock with the frequency which is (N1×N2) times as large as the frequency of the reference clock.

Then, a training pattern of the clock generating circuit 104 is generated from the DUT 150. The training pattern is a series of data having a predetermined data variation rate and a pattern obtained by synchronizing the phase of the output data of the DUT 150 and the reproduced clock. Thus, during this step, a process of comparing the training pattern with the expectation value is not performed by the logic comparing unit 110.

The data of the training pattern output from the DUT 150 is input to a channel connected to the clock generating circuit 104 of the testing apparatus 100. If the training pattern is input to the testing apparatus 100, the training pattern branches off after level comparison is performed by the level comparator 106 and they are input to the timing comparator 108 and the phase comparing unit 122.

The phase comparing unit 122 compares phase of the reproduced clock of which frequency is divided by N1 by the N1 frequency divider 128 with that of the training pattern and outputs a first phase comparison result signal which is data showing phase lead or delay. Further, since the output data of the DUT 150 is random data and existence of a variation point of data is different according to a cycle, the phase comparing unit 122 performs the phase comparison and outputs the first comparison result signal only in case a variation point exists in the output data of the DUT 150 and does not perform the phase comparison in case no variation point exists in the output data of the DUT 150.

The first comparison result signal output by the phase comparing unit 122 is smoothed by the LPF 120 and then added to the second comparison result signal output from the phase comparing unit 130 by the adding unit 132. Then, the VCO 138 performs feedback control so that a phase difference between the output data of the DUT 150 and the reproduced clock can be eliminated and generates the reproduced clock. As a result, the phase of the reproduced clock is synchronized with that of the output data of the DUT 150 while the frequency of the output data of the DUT 150 is maintained to be (N1×N2) times as large as that of the reference clock.

Then, a testing on the DUT 150 is started as phase synchronization and frequency synchronization are taken by the clock generating circuit 104. During the testing of the DUT 150, the reproduced clock of which frequency is divided by N1 by the N1 frequency divider 128 is delayed by the variable delay circuit 124 and a strobe of a predetermine timing is provided to the timing comparator 108. Then, the output data of the DUT 150 is obtained by the timing comparator 108 at a predetermined timing based on the strobe and compared with the expectation value by the logic comparing unit 110.

During the testing, the clock generating circuit 104 compares the phase of the output data of the DUT 150 with that of the reproduced clock all the time and the VCO 138 performs feedback control during testing. Therefore, even in case the phase of the output data of the DUT 150 is varied due to drift caused by variation in chip temperature, it is possible to generate the reproduced clock following up the phase variation of the DUT 150 if the variation is less than the first frequency, which is a cutoff frequency of the LPF 120.

As mentioned above, according to the testing apparatus 100 of the present embodiment, it is possible to generate the reproduced clock from the output data of the DUT 150 and obtain the output data of the DUT 150 at a desired timing using the phase of the reproduced clock as a reference for the testing on the high-speed serial interface of clock embedding type. Further, it is possible to improve a general-purpose property of the testing apparatus and correspond to the output data rate of the DUT 150 of a wide range by letting the frequency of the reference clock and the frequency dividing ratios of the N1 frequency divider 128 and the N2 frequency divider 126 variable. Further, since a range of the output frequency of the VCO 138 is generally octave-variable, it is possible to correspond to the range of the output data rate of the DUT 150 by using two frequency dividers of the N1 frequency divider 128 and the N2 frequency divider 126.

Further, since the DUT 150 operates based on the reference clock generated by the reference clock source 102, the frequency of the output data of the DUT 150 is known and necessarily is not changed in the testing apparatus 100. Therefore, it is possible to make the phase and frequency locked loop circuits, which are made separately, operate simultaneously. In addition, since a loop band of each of the frequency and phase locked loop circuits can be set separately by each of the LPF 120 and the LPF 134, it is possible to reduce a settling time for frequency synchronization to suppress noises of the VCO 138 by raising the loop band of the frequency locked loop circuit and cut off jitter components of the output data of the DUT 150 by lowering the loop band of the phase locked loop circuit. Further, it is possible to satisfy a jitter tolerance standard of the DUT 150 to be tested by letting the cutoff frequency of the LPF 120 variable.

Figure 3:
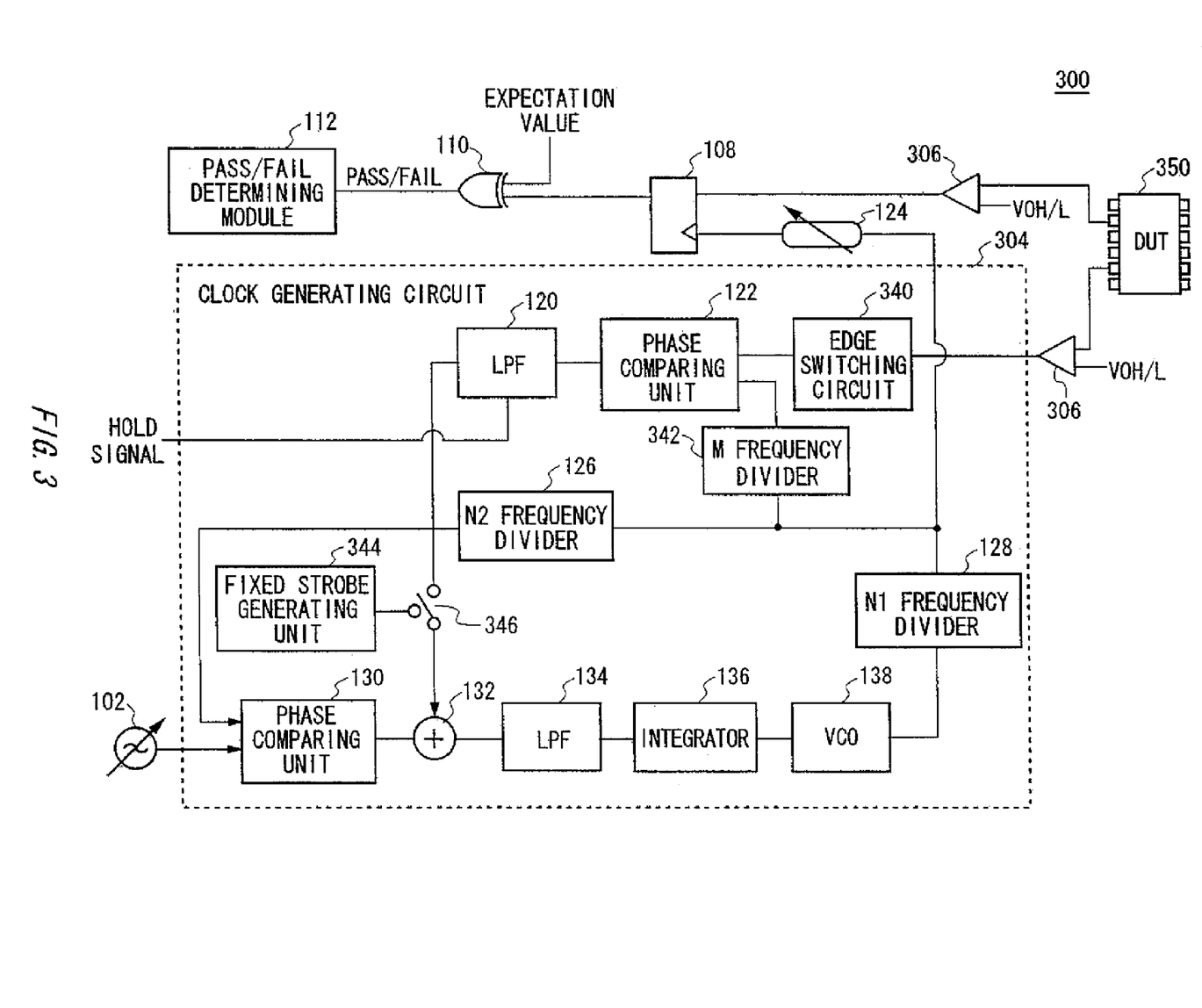
FIG. 3 shows an example of the configuration of a testing apparatus according to a second embodiment.
Figure 4:
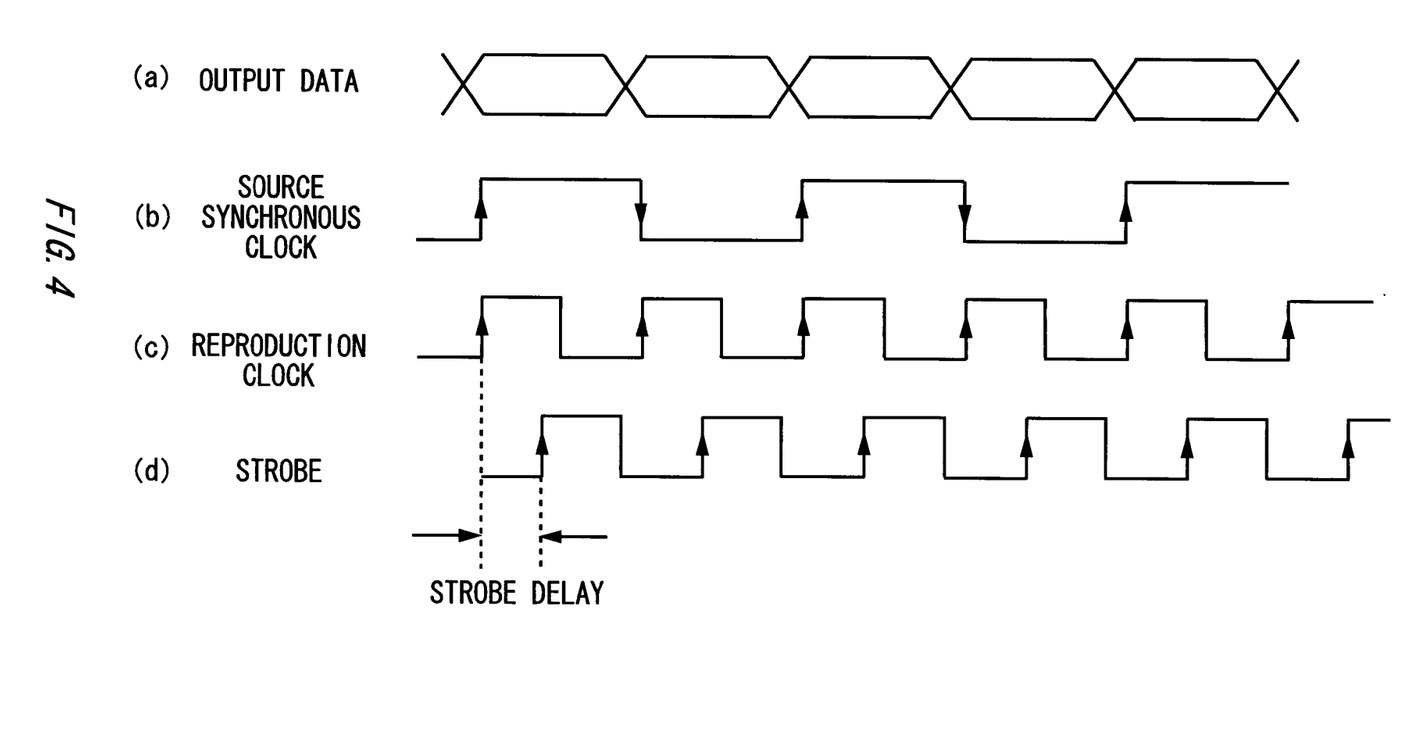
FIG. 4 shows an example of a timing chart of output data, a source synchronous clock, are produced clock, and a strobe.
Figure 5:
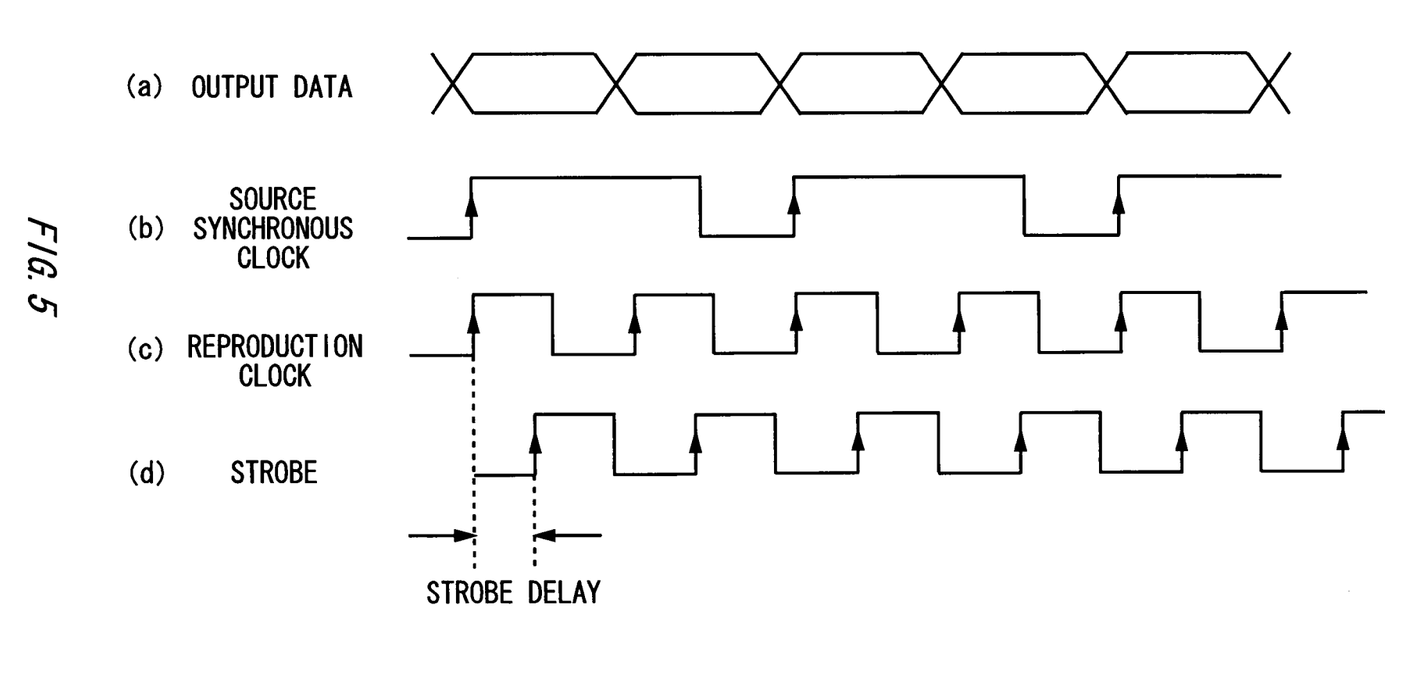
FIG. 5 shows an example of a timing chart of output data, a source synchronous clock, are produced clock, and a strobe.

FIG. 3 shows an example of the configuration of a testing apparatus 300 according to a second embodiment of the present invention. Further, each of FIGS. 4A and 5A shows an example of a timing chart of output data of a DUT 350 according to the second embodiment. Each of FIGS. 4B and 5B shows an example of a timing chart of a source synchronous clock of the DUT 350 according to the second embodiment. Each of FIGS. 4C and 5C shows an example of a timing chart of a reproduced clock generated by a VCO 138 according to the second embodiment. Each of FIGS. 4D and 5D shows an example of a timing chart of a strobe generated by a variable delay circuit 124 according to the second embodiment. Further, since the configuration and function of the testing apparatus 300 according to the second embodiment are the same as those of the testing apparatus 100 according to the first embodiment with the exception of the part described in the following, description on the constitution and function which are the same as those of the testing apparatus 100 according to the first embodiment will be omitted.

The testing apparatus 300 includes a level comparator 306 in addition to the elements included in the testing apparatus 100 according to the first embodiment. Further, a clock generating circuit 304 includes an edge switching circuit 340, an M frequency divider 342, a fixed strobe generating unit 344, and a switch 346 in addition to the elements included in the clock generating circuit 104 according to the first embodiment. Although the testing apparatus 100 according to the first embodiment includes the clock generating circuit 104 for testing the high-speed serial interface of clock embedding type, the testing apparatus 300 according to the second embodiment includes the clock generating circuit 304 for testing a high-speed serial interface of source synchronous type. Further, a source synchronous clock is an example of an output data or an output clock. The testing apparatus 100 according to the first embodiment may include the fixed strobe generating unit 344 and the switch 346 and have the operation and function described in the following.

The DUT 350 includes the serial interface of source synchronous type and outputs the output data as shown in FIGS. 4A and 5A and the source synchronous clock as shown in the FIGS. 4B and 5B. Here, two kinds of the source synchronous type are a double data rate (DDR) type where both of a rising edge and a falling edge are timing edges and a single data rate (SDR) type where one of a rising edge and a falling edge is a timing edge. Further, the edge switching circuit 340 is provided just before the phase comparing unit 122 on a transmission path from the DUT 350 to the phase comparing unit 122 and selects an edge of which phase is to be compared by the phase comparing unit 122 out of edges of the synchronous clock output from the DUT 350 to provide the phase comparing unit 122 with it. Thus, the testing apparatus 300 can test both of the DUT 350 including a high-speed serial interface of double data rate type and the DUT 350 including a high-speed serial interface of single data rate type.

Further, the ratio of frequency of the output data to that of the source synchronous clock is not limited to 1:1 and may be one of 1:2. 1:4, or the like. Further, the M frequency divider 342 is provided just before the phase comparing unit 122 on a transmission path from the N1 frequency divider 128 to the phase comparing unit 122 and further divides the frequency of the reproduced clock of which frequency is divided by N1 by the N1 frequency divider 128 by M to provide the phase comparing unit 122 with it. Thus, the M frequency divider 342 makes the frequency of the reproduced clock provided to the variable delay circuit 124 different from that of the reproduced clock provided to the phase comparing unit 122 and the frequency of the reproduced clock provided to the phase comparing unit 122 the same as that of the source synchronous clock. Thus, the testing apparatus 300 can test the DUT 350 including the high-speed serial interface of source synchronous type where the ratio of the frequency of the output data to that of the source synchronous clock is various.

The fixed strobe generating unit 344 generates a fixed phase difference signal showing a phase difference between the reference clock and the reproduced clock. Then, the switch 346 provides the adding unit 132 with the first comparison result signal output by the phase comparing unit 122 or the fixed phase difference signal generated by the fixed strobe generating unit 344. In other words, in case the switch 346 selects the first comparison result signal and provides the adding unit 132 with it, the VCO 138 generates a reproduced clock following up the source synchronous clock of the DUT 350 as shown in FIGS. 4C and 5C. Then, the variable delay circuit 124 delays the reproduced clock generated by the clock generating circuit 304 and generates the strobe as shown in FIGS. 4D and 5D. In the meantime, in case the switch 346 selects the fixed phase difference signal and provides the adding unit 132 with it, the VCO 138 generates a reproduced clock which has a phase difference shown by the fixed phase difference signal with respect to the reference clock and does not follow up the source synchronous clock of the DUT 350. Thus, the testing apparatus 300 can obtain the output data of the DUT 350 by the strobe having the phase difference fixed with respect to the reference clock as well as the strobe following up the source synchronous clock of the DUT 350 to perform a testing.

The LPF 120 outputs a fixed value to the adding unit 132 based on a hold signal instead of the first comparison result signal in case the source synchronous clock output by the DUT 350 is unstable such as the case where a predetermined time has not elapsed from the time when the DUT 350 begins to output the source synchronous clock. In other words, in case the LPF 120 selects the first comparison result signal to provide the adding unit 132 with it, the VCO 138 generates the reproduced clock of which phase is synchronized with that of the source synchronous clock of the DUT 350 as shown in FIGS. 4C and 5C. Then, the variable delay circuit 124 delays the reproduced clock generated by the clock generating circuit 304 and generates the strobe as shown in FIGS. 4D and 5D. In the meantime, in case the LPF 120 provides the adding unit 132 with the fixed value based on the hold signal, the VCO 138 generates a reproduced clock of which phase is not synchronized with not the phase of the source synchronous clock of the DUT 350 but the phase of the reference clock. Further, the LPF 120 included in the testing apparatus 100 according to the first embodiment may also output a fixed value based on a hold signal similarly with the LPF 120 as described above.

Thus, in case of stopping phase synchronization such as the case where the phase of the source synchronous clock of the DUT 350 is unstable for the testing apparatus 300 according to the second embodiment and the output data of the DUT 150 is a long continuous pattern of zeros or ones for the testing apparatus 100 according to the first embodiment, it is possible to stop operation of the phase locked loop temporarily.

According to the present invention, it is possible to test a device under test including a high-speed serial interface of clock embedding type accurately.

Although the present invention has been described by way of exemplary embodiments, it should be understood that those skilled in the art might make many changes and substitutions without departing from the spirit and the scope of the present invention which is defined only by the appended claims.

What is claimed is:

1. A testing apparatus for testing a device under test comprising:
   a reference clock source for generating a reference clock for controlling operation of the device under test;
   a clock generating circuit for generating a reproduced clock of which frequency and phase are substantially the same as frequency of the reference clock and phase of output data of the device under test, respectively;
   a delay circuit for generating a strobe for delaying the reproduced clock;
   a timing comparator for obtaining an output value of the output data based on the strobe;
   a logic comparing unit for comparing the output value with a predetermined expectation value; and
   a pass/fail determining module for determining pass/fail of the device under test based on the comparison result of said logic comparing unit,
   wherein said clock generating circuit comprises:
   a first phase comparing unit for comparing phase of the output data of the device under test with that of the reproduced clock and outputting a first comparison result signal;
   a second phase comparing unit for comparing phase of the reference clock with that of the reproduced clock and outputting a second comparison result signal;
   an adding unit for adding the first comparison result signal and the second comparison result signal and outputting an addition result signal; and a reproduced clock generating module for generating the reproduced clock based on the addition result signal.

2. The testing apparatus as claimed in claim 1 further comprising a first low pass filter for passing only the first comparison result signal of which frequency is lower than a first frequency, wherein
said adding unit adds the first comparison result signal passing through said first low pass filter and the second comparison result signal.

3. The testing apparatus as claimed in claim 2, wherein the first frequency showing a passband of said first low pass filter is set according to the kind of the device under test.

4. The testing apparatus as claimed in claim 3, wherein the first frequency showing the passband of said first low pass filter is set to correspond to an allowable jitter frequency of the device under test.

5. The testing apparatus as claimed in claim 2 further comprising a second low pass filter passing only the addition result signal of which frequency is lower than a second frequency, wherein
said reproduced clock generating module generates the reproduced clock based on the addition result signal passing through said second low pass filter.

6. The testing apparatus as claimed in claim 5, wherein the second frequency showing a passband of said second low pass filter is higher than or substantially the same as the first frequency.

7. The testing apparatus as claimed in claim 2, wherein said first low pass filter outputs a hold signal of a fixed value instead of the first comparison result signal.

8. The testing apparatus as claimed in claim 7, wherein said first low pass filter outputs the hold signal of the fixed value instead of the first comparison result signal in case the output data is unstable.

9. The testing apparatus as claimed in claim 7, wherein said first low pass filter outputs the fixed value instead of the first comparison result signal within a predetermined time from the time when the device under test begins to output the output data.

10. The testing apparatus as claimed in claim 1, wherein a delay amount of said delay circuit is set to correspond to specification of the device under test.

11. A testing apparatus for testing a device under test comprising:
    a clock generating circuit for generating a reproduced clock of which phase is substantially the same as that of output data of the device under test;
    a delay circuit for generating a strobe for delaying the reproduced clock;
    a timing comparator for obtaining an output value of the output data based on the strobe;
    a logic comparing unit for comparing the output value with a predetermined expectation value; and
    a pass/fail determining module for determining pass/fail of the device under test based on the comparison result of said logic comparing unit,
    wherein said clock generating circuit comprises:
    a phase comparing unit for comparing phase of the output data of the device under test with that of the reproduced clock and outputting a comparison result signal;
    a first low pass filter for passing only the comparison result signal of which frequency is lower than a predetermined frequency set according to a kind of the device under test; and
    a reproduced clock generating module for generating the reproduced clock based on the comparison result signal.

12. The testing apparatus as claimed in claim 11, wherein said phase comparing unit compares phase of an output clock of the device under test with that of the reproduced clock generated by said reproduced clock generating module and outputs the comparison result.

13. The testing apparatus as claimed in claim 11, further comprising a frequency divider for dividing frequency of the reproduced clock generated by said reproduced clock generating module, wherein
  said phase comparing unit compares phase of an output clock of the device under test with that of the reproduced clock of which frequency is divided by said frequency divider and outputs the comparison result.

14. A testing method for testing a device under test comprising:
  generating a reference clock for controlling operation of the device under test;
  generating a reproduced clock of which frequency and phase are substantially the same as frequency of the reference clock and phase of output data of the device under test, respectively;
  generating a strobe for delaying the reproduced clock;
  obtaining an output value of the output data based on the strobe;
  comparing the output value with a predetermined expectation value; and
  determining pass/fail of the device under test based on the comparison result,
  wherein said reproduced clock generating comprises:
  comparing phase of the output data of the device under test with that of the reproduced clock and outputting a first comparison result signal;
  comparing phase of the reference clock with that of the reproduced clock and outputting a second comparison result signal;
  adding the first comparison result signal and the second comparison result signal and outputting an addition result signal; and
  generating the reproduced clock based on the addition result signal.

15. A testing method for testing a device under test comprising:
  generating a reproduced clock of which phase is substantially the same as that of output data of the device under test;
  generating a strobe for delaying the reproduced clock;
  obtaining an output value of the output data based on the strobe;
  comparing the output value with a predetermined expectation value; and
  determining pass/fail of the device under test based on the comparison result, wherein said reproduced clock generating comprises:
  comparing phase of the output data of the device under test with that of the reproduced clock and outputting a comparison result signal;
  passing only the comparison result signal of which frequency is lower than a predetermined frequency set according to the kind of the device under test; and
  wherein said reproduced clock generating generates the reproduced clock based on the comparison result signal.

16. The testing method as claimed in claim 15, wherein said reproduced clock generating further comprises a step of comparing phase of an output clock of the device under test with that of the reproduced clock generated in said reproduced clock generating and outputting a comparison result signal.

\* \* \* \* \*